US005637146A

United States Patent [19]
Chyi

[11] Patent Number: 5,637,146
[45] Date of Patent: Jun. 10, 1997

[54] METHOD FOR THE GROWTH OF NITRIDE BASED SEMICONDUCTORS AND ITS APPARATUS

[75] Inventor: Jen-Inn Chyi, 3F, No. 38, Lane 8, Gao-Shuang Road, Ping-Chen, Taoyuan Hsien, Taiwan

[73] Assignees: Saturn Cosmos Co., Ltd.; Jen-Inn Chyi, both of Taiwan

[21] Appl. No.: 413,364

[22] Filed: Mar. 30, 1995

[51] Int. Cl.$^6$ .................................................. C30B 35/00
[52] U.S. Cl. ......................... 117/200; 117/108; 117/202; 118/723 VE
[58] Field of Search .................... 117/9, 108, 200, 117/202, 953; 118/723 VE, 723 MR, 723 MA, 723 ER; 505/732

[56] References Cited

U.S. PATENT DOCUMENTS

| | | | |
|---|---|---|---|
| 4,615,756 | 10/1986 | Tsujii et al. | 156/345 |
| 4,683,838 | 8/1987 | Kimura et al. | 118/723 VE |
| 4,950,642 | 8/1990 | Okamoto et al. | 505/732 |

FOREIGN PATENT DOCUMENTS

| | | | |
|---|---|---|---|
| 3241173 | 10/1988 | Japan | 118/728 |

OTHER PUBLICATIONS

M.A. Herman, H. Sitter, "Molecular Beam Epitaxy: Fundamentals and Current Status," Springer-Verlag, pp. 29–42, 1989.

Shuji Makamura et al., "Candela-class high-brightness InGaN/AlGaN double-heterostructure blue-light-emitting diodes," Appl. Phys. Lett. 64(13), 28 Mar. 1994, pp. 1687–1689.

Shuji Nakamura, et al., "Highly P-Typed Mg-Doped GaN Films Grown with GaN Buffer Layers," Jpn. J. Appl. Phys., vol. 30, No. 10A, Oct., 1991, pp. L 1708–L 1711.

Hiroshi Amano, et al., "P-Type Conduction in Mg-Doped GaN Treated with Low-Energy Electron Beam Irradiation (LEEBI)", Jpn. J. Appl. Phys., vol. 28, No. 12, Dec. 1989, pp. L 2112 –L 2114.

W.E. Hoke, et al., "Evaluation of a new plasma source for molecular beam epitaxial growth of InN and GaN films," Journal of Crystal Growth 111 (1991) 1024–1028.

Shuji Nakamura, et al., "Hole Compensation Mechanism of P-Type GaN Films," Jpn. J. Appl. Phys., vol. 31 (1992), pp. 1258–1266.

"Superconducting Films of $YBa_2Cu_3Ox$ and Bi–Sr–Ca–Cu–O Fabricated by Electron–Beam Deposition with a Single Source;" Terasaki, et al; Japanese Journal of Applied Physics; vol. 27, No. 8, Aug., 1988, pp. L1480–L1483.

*Primary Examiner*—Nam Nguyen
*Assistant Examiner*—FeLisa Garrett

[57] ABSTRACT

A method for the growth of semiconducting nitrides, such as GaN, InN, AlN, and their alloys, in an ultra-high vacuum chamber, wherein low energy atomic nitrogen is generated by a plasma-excited radical atom source, the atom beam is introduced to the heated substrate within a short distance, other gaseous reactants and dopants, such as TMGa, TMIn, TMAj, DEZn, $CP_2Mg$, $SiH_4$, and similar organmetallic and hydride sources, are injected from a circular injector located between the substrate and the atom source, and therefore large area epitaxy with high growth rate is obtained.

23 Claims, 5 Drawing Sheets

METHOD FOR THE GROWTH OF NITRIDE BASED SEMICONDUCTORS AND ITS APPARATUS

BACKGROUND OF THE INVENTION

The present invention relates to a method for the growth of nitride based semiconductors such as GaN, InN, AlN and other alloys. The invention relates also to an apparatus for use with such a method.

GaN and its related compound semiconductors are the key materials for blue-green light emitting diodes (LEDs) and semiconductor lasers. The preparation of high quality epitaxial layer of this material has been intensively pursued for over twenty years (see J. Pankove, U.S. Pat. No. 3,864,592; H. Kobayashi et. al., U.S. Pat. No. 4,473,938; K. Manabe et. al., U.S. Pat. No. 4,911,102). The main obstacle to the achievement of high efficiency light emitting diode is the preparation of highly conductive p-type GaN. Low energy electron beam irradiation (see H. Amano et. al., "P-type conduction in Mg-doped GaN treated with low-energy electron beam irradiation (LEEBI)," Jpn. J. Appl. Phs. 28, L2112–L2114, 1989) and thermal annealing (see S. Nakamura et. al., "Hole compensation mechanism of p-type GaB films," Jpn. J. Appl. Phys. 31, 1258–1266, 1992) have been used to activate the Mg-doped GaN epilayers. Dehydrogenation was proposed to be the critical step since highly conductive p-type GaN films could be grown in a hydrogen-free ambient (see M. E. Lin st. al., Appl. Phys. Lett. 63, 932–934, 1993; C. Wang and R. F. Davis, Appl. Phys. Lett. 63, 990–992, 1993; M. Rubin et. al., Appl. Phys. Lett. 64, 64, 1994). This invention presents the design of a chemical beam epitaxy system and the method for the epitaxial growth of large area epitaxial layers of GaN and its related compounds.

Conventionally, there are two most effective methods to prepare GaN epilayers, namely molecular beam epitaxy (MBE) and organometallic vapor phase epitaxy (MOVPE). Because molecular nitrogen is too inert to react with Ga, radio-frequency plasma-assisted growth methods (see W. E. Hoke, P. J. Lemonias and D. G. Weir, "Evaluation of a new plasma source for molecular beam spitaxial growth of InN and Gan films", J. Crystal Growth III, pp. 1024–1028, 1991 and M. Liu, A. C. Frenfel, J. G. Kim, and R. M. Park, "Growth of zinc blende-GaN on β-SiC coated (001) Si by molecular bem epitaxy using a radio frequency plasma discharge, nitrogen free-radical source", J. Appl, Phys, 74, pp. 6124–6127, 1993) and microwave plasma-assisted growth methods (see C. H. Carter, Jr., U.S. Pat. No. 5,210, 051, May 1993 have been most widely used for MBE while $NH_3$ is used for MOVPE (K. Manade et al., U.S. Pat. No. 4,911,102, March 1990). The group III sources used are elemental metals evaporated from effusion cells for MBE and vapors from metal-organic compounds for MOVPE, respectively.

Using a plasma-assisted growth method, MBE shows only limited success.

Though the material obtained by MBE is of reasonably high quality, the growth rate is less than 0.6 um/h. This slow growth rate is attributed to the limited reactive nitrogen atom or ion flux provided by the plasma source for the growth of stoiohiometric films. The usable flux in a MBE system is determined by the efficiency of the nitrogen source and the distance between the substrate and the source. Because of the divergent nature of the nitrogen beam, the usable flux decreases dramatically as the substrate is located far away from the nitrogen source. Further, increasing the nitrogen rate into the plasma source raises the growth pressure above $10^{-4}$ Torr and reduces the mean free path of the reactants, which deteriorates the growth rate. Modification made on the conventional MBE chamber to accommodate the plasma source can not avoid the difficulties mentioned above which shorter distance between the substrate and the plasma source will either affect the uniformity of the epilayer or damages the epilayer when an electron cyclotron resonance (ECR) source is used.

Currently, the only method that is employed for the production of GaN LEDs is MOVPE. Because high quality GaN can only be grown at 1000°–1100° C., thermal convection and gas phase pre-reaction have impeded the success of conventional MOVPE method. A two-flow reaction chamber has been proposed (see S. Nakamura, Jpn. J. Appl. Phys. 30, L1705–L1707, 1991) to overcome these barriers and produce high brightness blue LEDs. However, this method has disadvantages. Though the thermal convection and gas phase pre-reaction can be somewhat suppressed by reducing the pressure in the reactor, a large amount of pressing gas is still necessary for the growth of GaN. Morever, the nitrogen source, i.e. $NH_3$, used in this method produces a great amount of hydrogen which is detrimental to the p-type GaN. Therefore, post-annealing on the MOVPE grown epilayers above 700° C. in a nitrogen ambient to activate p-type dopant Mg is necessary. Moreover, the manner of the introduction of the reactant gas to the substrate hinders uniform growth of epilayers over a large area, e.g. greater than two inch diameter.

SUMMARY OF THE INVENTION

Compared to the conventional plasma-assisted MBE, this invention will:

a. enhance the growth rate to a comparable level as that of MOVPE method because the nitrogen atom source is placed at about 10 cm from the substrate to obtain higher flux rather than the 15 cm in the conventional MBE case.

b. eliminate the damage and etching effects caused by nitrogen ions because low energy (estimated to be less than 1 eV) excited and ground state nitrogen atoms are produced by an RF plasma source.

c. enable the epitaxial growth on large substrate because large diameter atom source (6 inch in diameter) is commercially available.

d. reduce the size of the growth chamber required for growing substrates of comparable size because conventional Ga effusion cell needs longer distance to achieve high uniformity.

e. reduce the surface oval defects caused by Ga effusion cell.

Compared to the two-flow MOVPE, this invention will:

a. minimize the content of hydrogen during the growth because no $H_2$ and $NH_3$ are used in this process. Therefore post-annealing may not be necessary.

b. eliminate the use of large amounts of pressing and reactant gases because there is much less thermal convection and pre-reaction.

c. Allow a lower growth temperature ($\leq 800°$ C. compared to ~1050° C.) because highly reactive nitrogen atom is used.

d. enable the epitaxial growth on large substrate because no complicated gas flow is involved in this apparatus.

e. enable effective surface cleaning at low temperature using hydrogen atoms generated by the plasma source.

Using the apparatus and the process invented and described herein, the following effects, which leads to higher productivity and yield, can be obtained:

(1). A high growth rate (~1 um/h) can be obtained because high nitrogen atom flux is used.

(2). Large area epitaxy is possible because no complicated gas flow pattern is involved, large diameter atom source is used, and the reactant gases are injected from a symmetric and proper position.

(3). Lower growth temperature ($\leq 800°$ C.) is sufficient because very reactive reactants are used in an ultra-high vacuum environment (<50 sccm in total).

(4). A small amount of gas is needed because MBE method is used and no pressing gas is needed.

(5). Post-annealing may be omitted because hydrogen content is greatly reduced.

DETAILED DESCRIPTION OF THE PREFERRED EMBODIMENT

Figure 1:
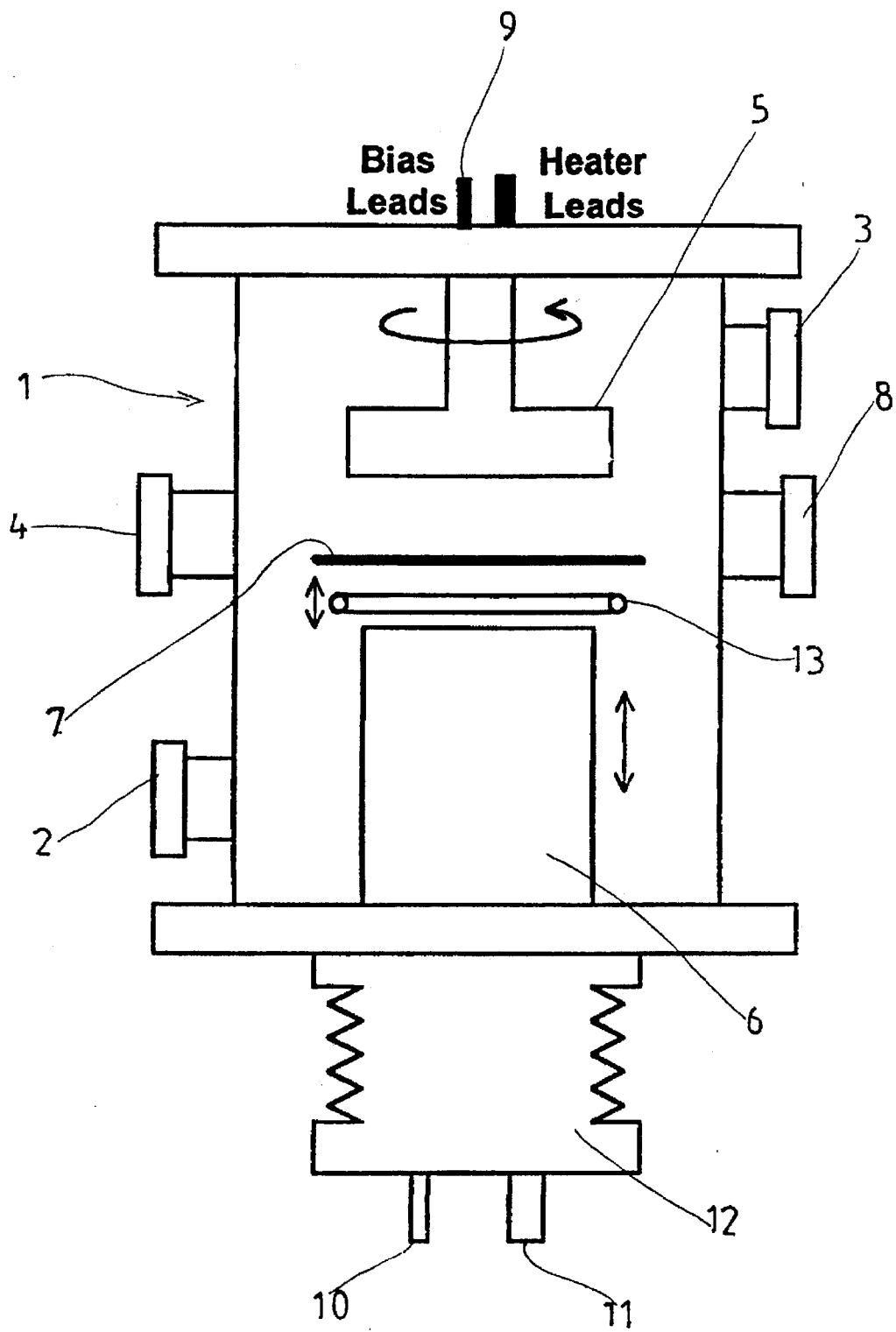
FIG. 1 is a diagram depicting a chemical beam epitaxy apparatus for the growth of GaN based semiconductors according to the present invention.
Figure 2:
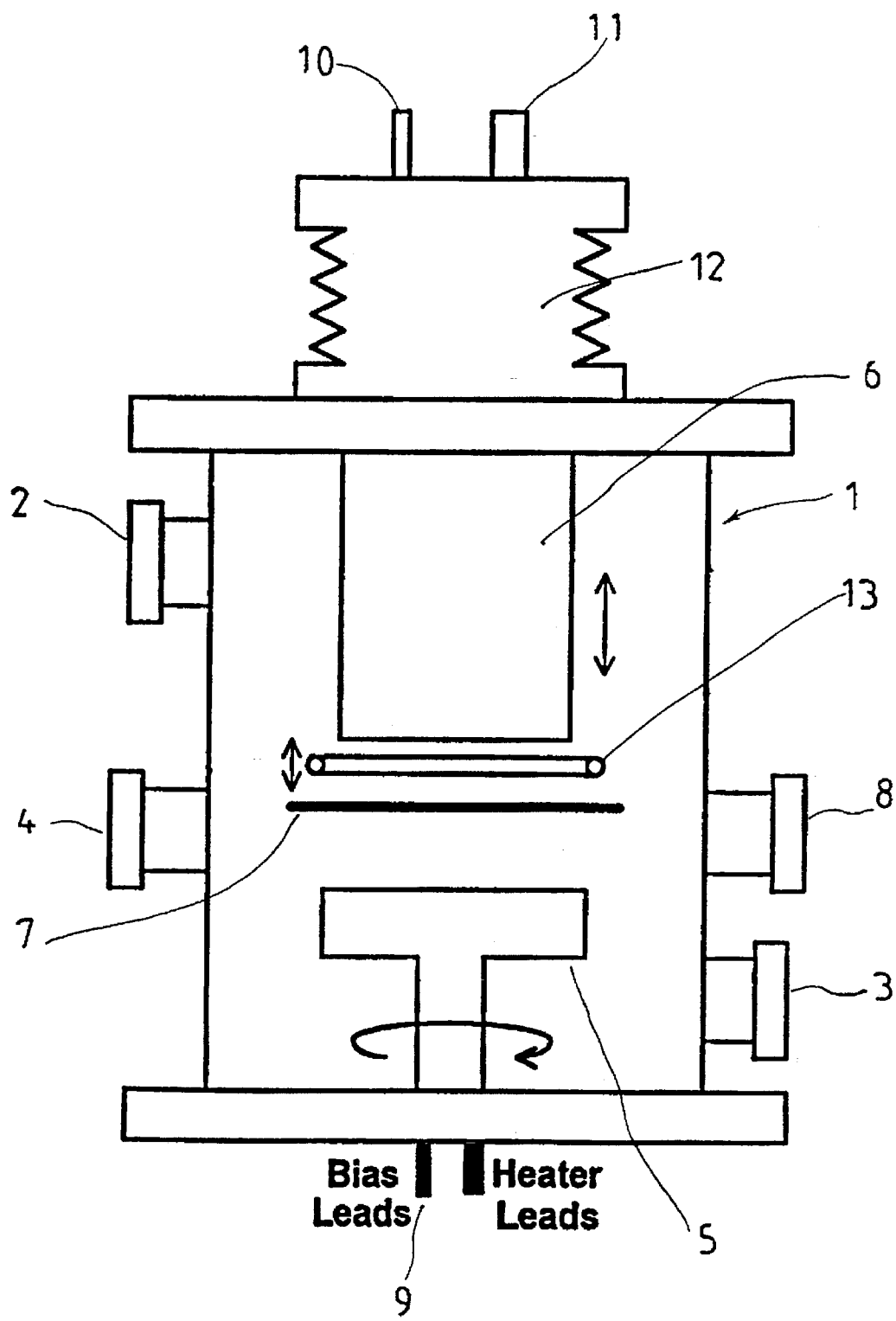
FIG. 2 shows another configuration of the apparatus according to the present invention.

Referring to FIGS. 1 and 2, an apparatus for the growth of nitride based semiconductors in accordance with the present invention comprises Ultra-high vacuum growth chamber 1, substrate manipulator 5, nitrogen atom source 6, and gas injector 13.

Ultra-high vacuum growth chamber 1, same as conventional MBE chamber, is made of stainless steel and has a cryo-shroud inside. This chamber is evacuated by either oil diffusion pump or turbo-molecular pump to reach ultra-high vacuum level. Ports of various sizes are present for a vacuum gauge 2, residual gas analyzer 3, reflection high energy electron diffraction (RHEED) 4, substrate manipulator 5, atom source 6, valve, shutter mechanism feedthrough, 7 gas line feedthrough 8, view port, and other in situ analysis instruments.

Substrate manipulator 5 can accommodate single wafer or multi-wafer substrate holder for production. Substrates can be heated up to 1000° C. as well as rotated to improve temperature uniformity across the substrate holder. Both DC and RF bias can be applied to the substrate via the feedthrough 9 on the manipulator flange.

Nitrogen atom source 6, equipped with a gas inlet 10 and an RF 11 feedthrough, is arranged in the same axis as the manipulator and is parallel to the substrate. This RF excited plasma source dissociates high purity $N_2$ into nitrogen atoms at excited and ground states. Since these atoms diverges with a half angle of about 15°, it is necessary to keep this atom source as close to the substrate as possible to minimize the loss of atom flux. The energy of these atoms is on the order of thermal energy (~300° C.), therefore, placing this source within 10 cm to the substrate will not result in any damage to the epilayer. This position can be adjusted externally by mounting this device on a bellow 12. The RF power and $N_2$ flow rate can also be adjusted to obtain the desired growth conditions. Other nitrogen atom sources, e.g. nitrogen thermal cracker, can also be used.

Figure 3A:
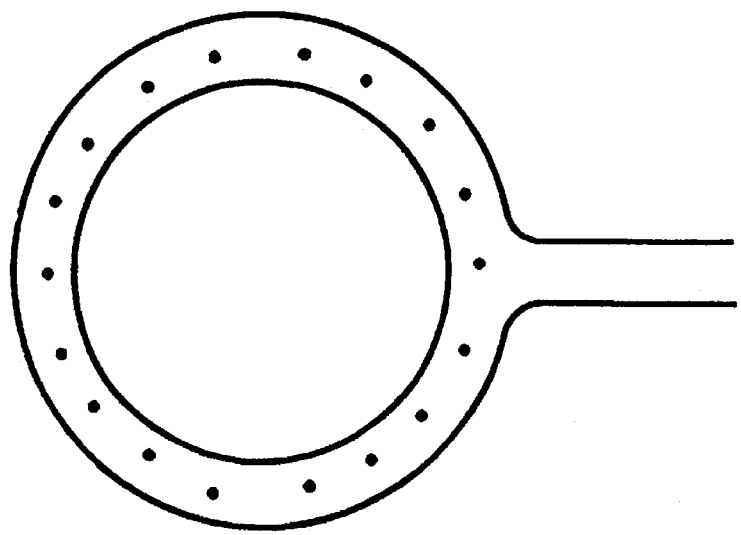
FIGS. 3(a) to 3(c) shows possible configurations of the gas injector according to the present invention.
Figure 3B:
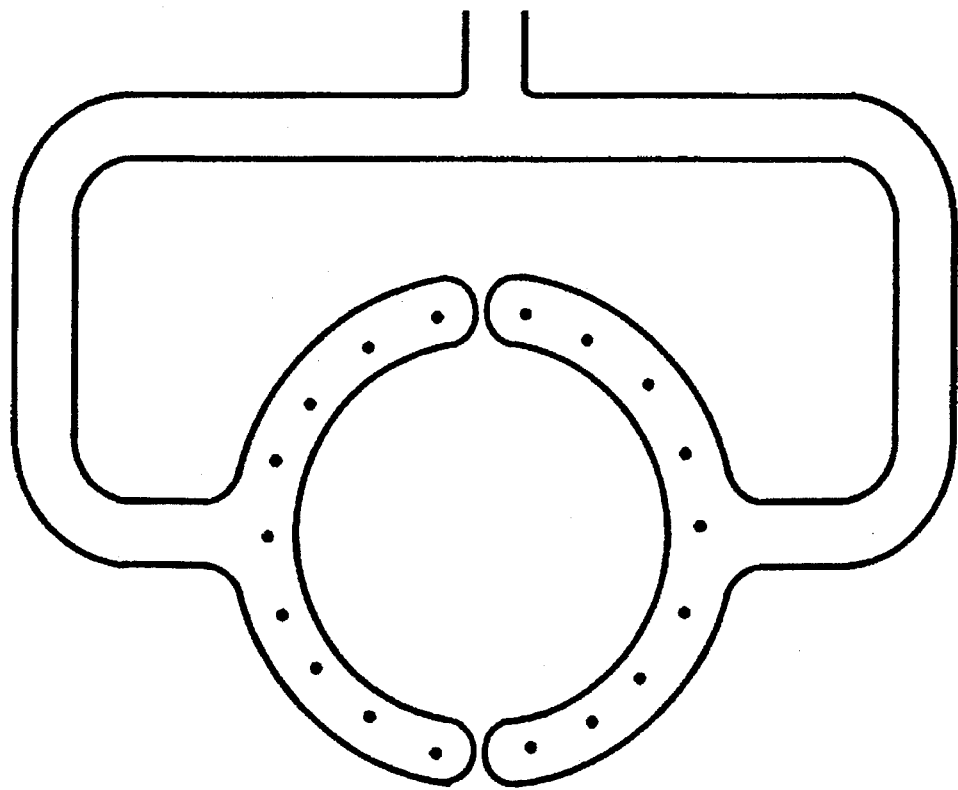
Figure 3C:
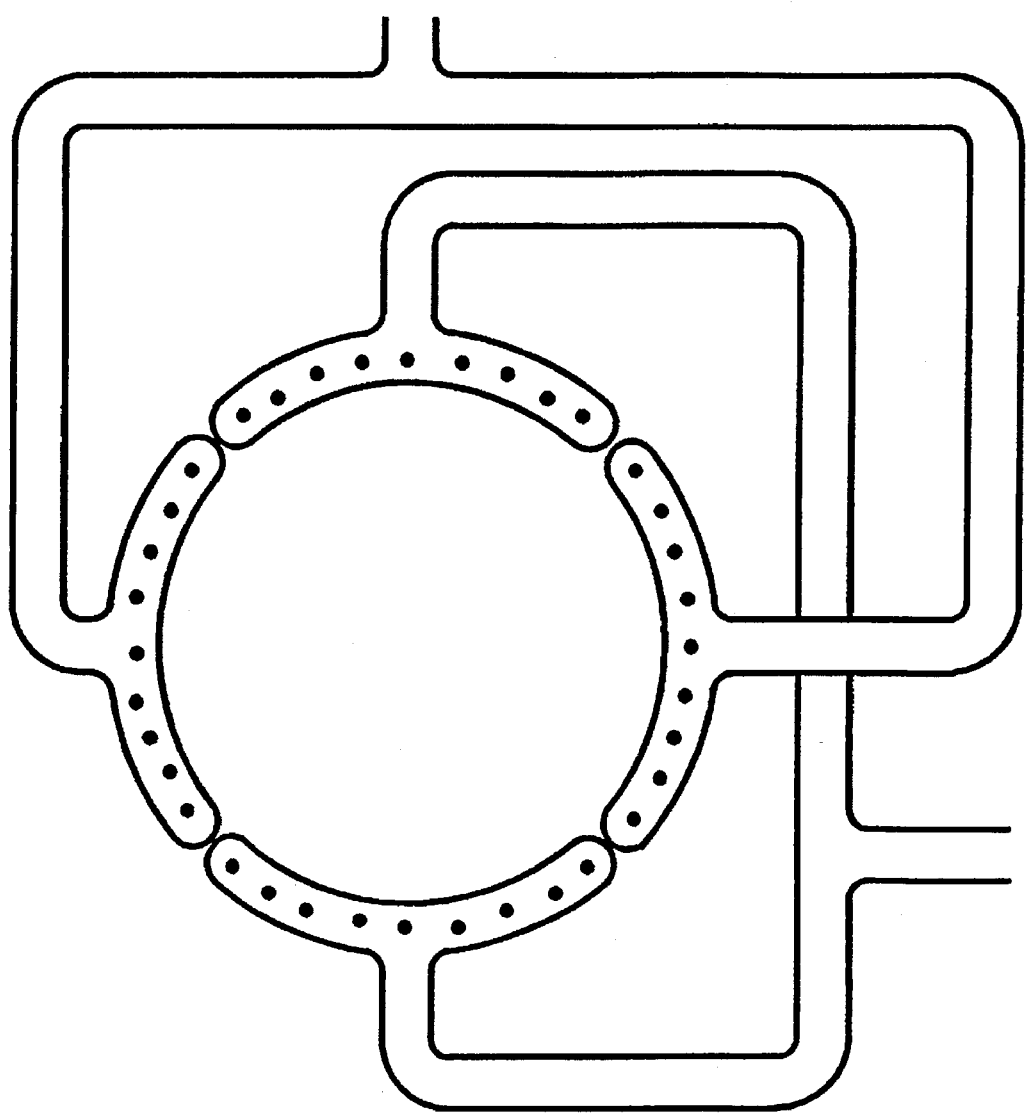

Gas injector 13 is used to inject the reactant and dopant gases except nitrogen. These gases are organometallic compounds and hydride gases, such as trimethylgallium (TMG), trimethylaluminum (TMA), trimethylindium (TMI), diethylzinc (DEZ), bis-cyclopentadiethylmagnesium ($Cp_2Mg$), and silane ($SiH_4$). These gases are well mixed in the gas tube before they are injected out of the injector. The gas injector is made of electropolished stainless steel with many openings on it. The size and the position of the openings is arranged to distribute gases to achieve good uniformity and reasonable growth rate across the whole wafer. This injector can be a circular ring in shape, shown in FIG. 3(a) or split into two semicircles, shown in FIG. 3(b), or four quadrants, shown in FIG. 3(c), in order to improve the uniformity of the gas distribution. This device is also arranged in the same axis as the manipulator while situated in a position between the atom source and the substrate. This position and the diameter of this injection can be adjusted to achieve the desired uniformity of the films.

The operation of the aforesaid apparatus is described as follows. A substrate, e.g., sapphire, is transferred onto the substrate manipulator and cleaned by high temperature heating or/and hydrogen plasma. The substrate is rotated to improve temperature uniformity and flux uniformity. With the main shutter opened, nitrogen atoms are first generated by the atom source and introduced to the substrate for the nitridation process. The growth of GaN and related compounds is commenced by introducing the desired organic-metallic source through the gas injector after the nitridation. The flow rate of each gas is controlled by mass flow controller or pressure regulation. The substrate temperature can be varied for different materials in order to achieve the optimum growth condition for each material. If necessary, a DC, periodic pulse train and/or RF power can be applied to the substrate. When the growth is finished, all the gases except nitrogen are stopped. The main shutter is kept open until the substrate temperature is below about 400° C.

EXAMPLES (1). The construction of a plasma-assisted chemical beam epitaxy system as shown in FIG. 1 is described in the following. In a cylindrical stainless steel ultra-high vacuum chamber evacuated by a high capacity turbomolecular pump, a substrate manipulator which can accommodate a 5 inch platen is installed on the top of the chamber. There can be three 2 inch or one 4 inch substrate on the platen. The manipulator is able to rotate the substrate with a speed of 30 rotations per minute, heat the substrate up to 1000° C., and bias the substrate up to 1000 V. The substrate temperature is measured using a set of thermalcouples located at the back side of the platen. Opposite to the substrate manipulator in a distance of about 10 cm is a nitrogen plasma source which has an aperture of 10 cm in diameter. Utilizing RF plasma, about 30% of the nitrogen molecules fed into the source are decomposed into nitrogen atoms in the excited and ground states. These low energy atoms come out of the aperture of the atom source within a half angle of about 15°, therefore the whole platen on the substrate manipulator is under a flux of nitrogen atoms. Meanwhile, the group III reactant gases and dopant gases are introduced through a circular gas injector with a diameter of about 13 cm. To achieve a uniform growth across the five inch platen, the gas injector is concentrically located at about 7 cm from the substrate and has many openings evenly distributed toward the substrate. The flow rate of each gas is controlled by upstream pressure or mass flow controller. An integrated gas manifold with vent-run valves for each gas is mounted on the growth chamber close to the gas injector. GaN-based compound semiconductors can thus be grown in this chamber by introducing the reactive nitrogen atoms and group III metalorganic vapors onto the heated substrate.

Figure 4:
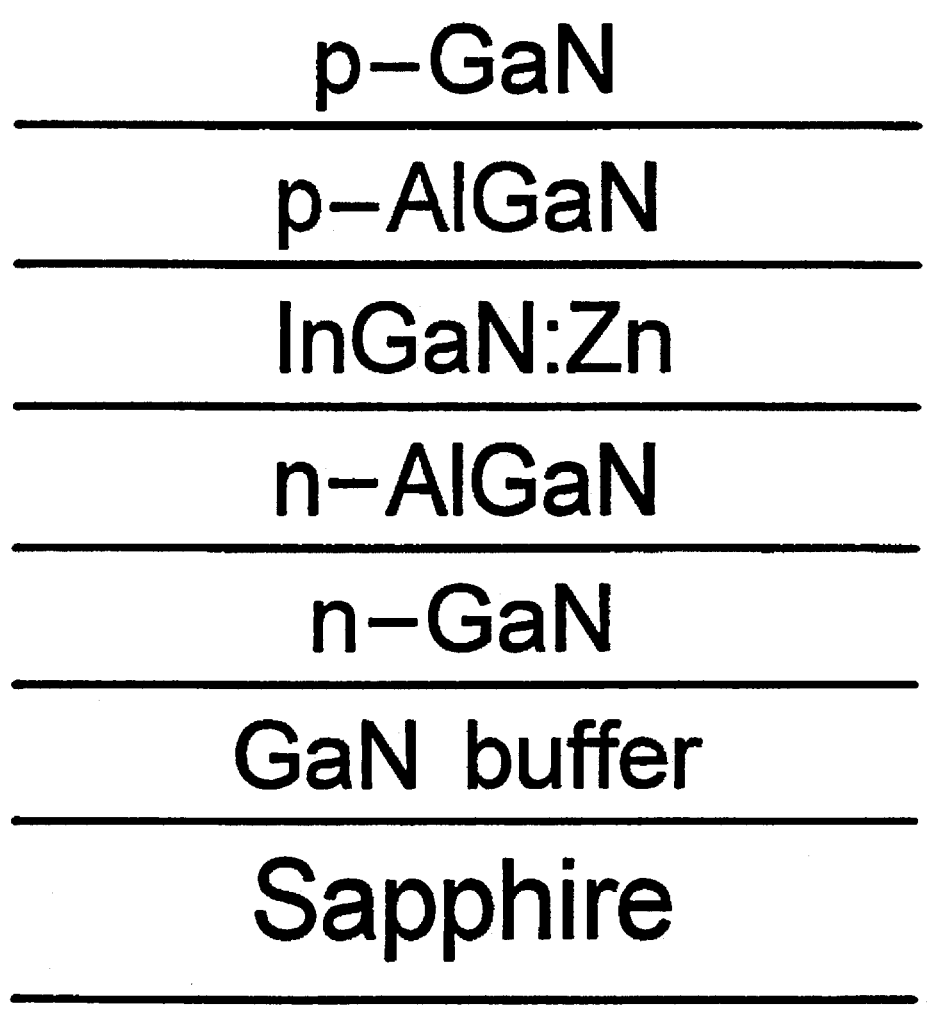
FIG. 4 is a schematic diagram of a GaN-based heterostructure.

(2). A process of producing a GaN based heterostructure as shown in FIG. 4 is described in the following referring to the apparatus shown in FIG. 1. The single crystal (0001) sapphire substrate which has been cleaned by chemical treatment, is first placed on the platen with its front side facing down and loaded into a load-lock vacuum chamber. After degassing the substrate under a vacuum level of $10^{-9}$ Torr, the substrate is transferred onto the substrate manipulator in the growth chamber. Then, the substrate is subjected to another heat cleaning or hydrogen plasma cleaning process which is monitored by observing the RHEED pattern. After cleaning, the substrate is exposed to a flux of nitrogen atoms for 20 min at 500° C. to form a thin layer of AlN on the surface of the sapphire substrate. The epitaxial growth is initiated at 500° C. for the initial 25 nm-thick GaN buffer layer. The flow rate of $N_2$ and TMG is 10 and 0.5 sccm, respectively. A second layer comprising n-type GaN layer is grown at 700° C. with TMG, $SiH_4$ and $N_2$ flowing into the growth chamber. A layer of n-type AlGaN, is grown by introducing a TMA source into the gas injector in addition to TMG, $SiH_4$, and $N_2$ gases. After growing this layer, the substrate temperature is lowered to 600° C. while only $N_2$ is left on. As the temperature is stabilized, TMG, TMI and DEZ are introduced to the substrate to grow a Zn-doped InGaN layer. Then, the substrate temperature is raised again to grow a layer of p-type AlGaN using $Cp_2Mg$. Finally, the TMA flow is stopped for the growth of the p-type GaN layer.

What is claimed is:

1. An apparatus for growing nitride based compound semiconductor epitaxial layers on at least one substrate; said apparatus comprising an ultra-high vacuum chamber including: a substrate manipulator for holding said at least one substrate, an atom source facing said substrate manipulator, said atom source being separated from said surface of said substrate manipulator at a distance of less than 15 cm for generating a flux of nitrogen atoms towards said at least one substrate, and at least one gas injector located between said substrate manipulator and said atom source for introducing other reactant and dopant gases into said chamber towards said at least one substrate.

2. The apparatus of claim 1 wherein said substrate manipulator, said at least one gas injector, and said atom source are arranged such that said substrate manipulator faces upward.

3. The apparatus of claim 1 wherein said substrate manipulator is supplied with at least one of a DC or a RF bias voltage to neutralize ions and reduce damage to the epitaxial layers caused by high energy nitrogen ions.

4. The apparatus of claim 1 wherein said at least one gas injector comprises at least two gas injectors, each for introducing respective gases to prevent cross contamination between said respective gases.

5. The apparatus of claim 1 wherein said at least one gas injector has the shape of a ring.

6. The apparatus of claim 1 wherein said at least one gas injector has the shape of a pair of semicircles.

7. The apparatus of claim 1 wherein said at least one gas injector has the shape of four quadrants.

8. The apparatus of claim 1, wherein said atom source is separated from said substrate manipulator at a distance of about 10 cm.

9. The apparatus of claim 1 wherein said nitride based compound semiconductor epitaxial layers are GaN based.

10. The apparatus of claim 1 wherein said atom source includes an aperture.

11. The apparatus of claim 10 wherein said aperture has a diameter of about 10 cm.

12. The apparatus of claim 1 wherein said atom source is arranged coaxial with said substrate manipulator.

13. The apparatus of claim 1 wherein said atom source generates said flux of nitrogen atoms within a half angle of about 15°.

14. The apparatus of claim 1 wherein said atom source is a RF excited plasma source.

15. The apparatus of claim 1 wherein said atom source and said at least one gas injector are arranged such that increasing said flux of nitrogen atoms does not decrease the mean free path of said reactant and dopant gases.

16. The apparatus of claim 1 wherein said substrate manipulator includes a heat source for heating said at least one substrate.

17. The apparatus of claim 1 wherein said at least one gas injector is coaxial with said substrate manipulator.

18. The apparatus of claim 1 wherein said at least one gas injector is located about 7 cm from said substrate manipulator.

19. The apparatus of claim 1 wherein said at least one gas injector includes a plurality of openings for introducing said reactant and dopant gases.

20. The apparatus of claim 1 wherein said at least one gas injector has a diameter of about 13 cm.

21. The apparatus of claim 1 wherein said atom source generates nitrogen atoms having an energy of less than 1 eV.

22. The apparatus of claim 1 wherein said atom source is arranged parallel to the surface of said substrate manipulator.

23. The apparatus of claim 1 wherein said substrate manipulator, said at least one gas injector and said atom source are arranged such that said substrate manipulator faces downward.

* * * * *